United States Patent [19]
Ide et al.

[11] Patent Number: 5,898,256
[45] Date of Patent: Apr. 27, 1999

[54] CONTAINER FOR ENCLOSING A PIEZO-ELECTRIC TRANSDUCER

[75] Inventors: Toshinori Ide; Kiyoshi Uchibori, both of Nagano; Makoto Wakasugi, Tokyo, all of Japan

[73] Assignees: Miyota Co., Ltd.; Citizen Watch Co., Ltd.

[21] Appl. No.: 08/836,102

[22] PCT Filed: Aug. 30, 1996

[86] PCT No.: PCT/JP96/02456

§ 371 Date: Apr. 29, 1997

§ 102(e) Date: Apr. 29, 1997

[87] PCT Pub. No.: WO97/08826

PCT Pub. Date: Mar. 6, 1997

[30] Foreign Application Priority Data

Aug. 30, 1995 [JP] Japan ................................. 7-246961

[51] Int. Cl.$^6$ .................................................. H01L 41/08
[52] U.S. Cl. ............................ 310/344; 310/351; 310/348
[58] Field of Search ................................. 310/344, 348, 310/351–356

[56] References Cited

U.S. PATENT DOCUMENTS 5,568,006 10/1996 Luff et al. ................................. 310/348

FOREIGN PATENT DOCUMENTS

| 53-061294 | 6/1978 | Japan . |
| 53-82287 | 7/1978 | Japan . |
| 54-029597 | 5/1979 | Japan . |
| 54-111476 | 8/1979 | Japan . |
| 58-66723 | 5/1983 | Japan . |
| 2-55727 | 4/1990 | Japan . |
| 3-220910 | 9/1991 | Japan . |

*Primary Examiner*—Mark O. Budd
*Attorney, Agent, or Firm*—Dickstein Shapiro Morin & Oshinski, LLP

[57] ABSTRACT

With a cylindrical case (10) and a base (18) for sealing an aperture part of the case (10), a piezo-electric transducer is enclosed in the case (10). The base (18) has a cylindrical shape and its section intersecting its axis at right angles at the part where the base (18) comes into contact with the case (10) is elliptical or nearly elliptical. The shape of an inner circumference of a section of the case (10) intersecting its axis at right angles at the part where the case (10) touches the base (18) is smaller than that of the section of the base (18), and is elliptical or nearly elliptical. The case (10) is a cylinder with one end closed and one end open. The piezo-electric transducer is enclosed by press fitting the base (18) into the open end of the case (10). In this case, a press-fitting allowance has a maximum value at parts between minor and major axes of the ellipse or near ellipse.

13 Claims, 8 Drawing Sheets

CONTAINER FOR ENCLOSING A PIEZO-ELECTRIC TRANSDUCER

FIELD OF THE INVENTION

This invention relates to a container for enclosing a piezo-electric transducer therein with a cylindrical case the sectional shape of which is elliptical or nearly elliptical and a base for sealing an aperture part of the cylindrical case and, more particularly, to a press-fitting allowance of a case and base.

DESCRIPTION OF THE RELATED ART

Piezo-electric transducers such as clock piezo-electric transducers used in electronics including watches are enclosed in containers and mounted, for example, on printed-circuit boards. Piezo-electric transducers are near U or rectangular thin plates. In order to efficiently house piezo-electric transducers having such shapes, the mounting height from the surface of printed-circuit boards must be lowered as much as possible. To achieve this, cylindrical containers for enclosing a piezo-electric transducer the sectional shape of which is nearly elliptical have been suggested. For example, Japanese Utility Model Application No. Hei 2-55727 has disclosed a cylindrical container for enclosing a piezo-electric transducer the sectional shape of which is nearly elliptical as mentioned above. With this container, a piezo-electric transducer is held in a case the sectional shape of which is nearly elliptical and an aperture of the case is sealed with a base. The joint of the case and base has a given press-fitting allowance width which is used to make the container airtight.

If the sectional shape of a container is nearly elliptical as in the above publication, pressure on the contact surface of a case and base varies along the circumference. Therefore, leakage occurs at the parts where pressure on the contact surface is low, which can make it impossible to perfectly seal the container. In order to reliably seal a container, press-fitting allowance having a maximum value at the arc parts corresponding to the minor axis of an ellipse and a minimum value at the arc parts corresponding to the major axis of the ellipse has been suggested in Japanese Patent Laid-Open Publication No. Sho 53-61294.

However, even with the technology described in the latter publication, sometimes a container cannot be perfectly sealed. A problem to be solved still exists.

DISCLOSURE OF THE INVENTION

The present invention is intended to solve the above problem. That is, its object is to provide a container for enclosing a piezo-electric transducer having an elliptical or nearly elliptical section which can be reliably sealed.

In order to achieve the above object, a container for enclosing a piezo-electric transducer according to the present invention includes a cylindrical case for housing a piezo-electric transducer therein and a base for sealing an aperture of the case, the base having an elliptical or nearly elliptical transverse section at the contact part with the case, and the cylindrical case with one end closed and one end open having a transverse section the inner shape of which is elliptical or nearly elliptical at the contact part with the base and is smaller than the transverse section of the base. A piezo-electric transducer is enclosed by fitting the base into the open end of the case. In this case a press-fitting allowance has a maximum value at arc parts between the minor and major axes of the ellipse or near ellipse.

Experiment has shown that with a container for enclosing a piezo-electric transducer having an elliptical or nearly elliptical section, leakage occurs at arc parts between its minor and major axes. The above container has larger press-fitting allowance at these parts than the other parts, which prevents leakage at these parts. As a result, it can be reliably sealed.

Furthermore, it is possible that the press-fitting allowance at the parts where the major axis and arc of the ellipse or near ellipse intersect has a minimum value. In addition, it is possible that the press-fitting allowance at the parts where the minor axis and arc of the ellipse or near ellipse intersect has a greater value than those at the parts where the major axis and arc intersect.

Locations of the parts having the maximum press-fitting allowance may be determined as follows. First, an ellipse or near ellipse of a base equal to the sectional shape of the above base and an ellipse or near ellipse is equal to the inner shape of the above case which has a nearly uniform press-fitting allowance for the above base. (each ellipse or near ellipse is a shape after plating). The minor and major axes of each ellipse or near ellipse are superposed respectively and from this position the above ellipse or near ellipse of the case is turned around the center of the ellipse or near ellipse. Press-fitting allowance at the parts near the point where the ellipse or near ellipse of the case first touches the ellipse or near ellipse of the base has a maximum value.

With a container having an elliptical or nearly elliptical section, the minor and major axes of a case and base are not necessarily superposed. A base may be fitted into a case with one turned around its center with respect to the other. With a container having a circular section, such a rotational shift creates no problem. However, with a container having an asymmetric, for example elliptical, section, an intended press-fitting allowance cannot be obtained by such a shift. As a result, desired pressure on a contact surface cannot be achieved. This rotational shift gives the maximum error of press-fitting allowance at the point where the inner one of the above two ellipses or near ellipses turned around the center first comes into contact with the outer one of the two, and in the vicinity thereof. Therefore, even if press-fitting allowance varies by a rotational shift, a large press-fitting allowance at this part will give a sufficient press-fitting allowance i.e. pressure on a contact surface to seal a container.

Further, the above near ellipse may consist of major circular arcs having a first radius of curvature and minor circular arcs having a second radius of curvature shorter than the first radius of curvature.

Further, the number of the above major and minor circular arcs is two respectively, and they may be alternately arranged. In this case a combination of two kinds of circular arcs makes machining easier.

Further, the parts near the points where the major and minor circular arcs connect may have a maximum press-fitting allowance. Leakage is most likely to occur at the parts near the connection points, and so widening of the press-fitting allowance at these parts prevents the leakage. Maximizing press-fitting allowance at the parts near the connection points also facilitates design and manufacture.

And further, at the point where the major and minor circular arcs connect, a tangent to the major circular arc and a tangent to the minor circular arc may intersect at an angle of 0 to 30 degrees or coincide. In this case, the major and minor circular arcs connect in a virtually smooth way near this connection point, and so they do not form an angle. As a result, leakage can be reliably prevented.

DESCRIPTION OF THE PREFERRED EMBODIMENTS

Figure 1:
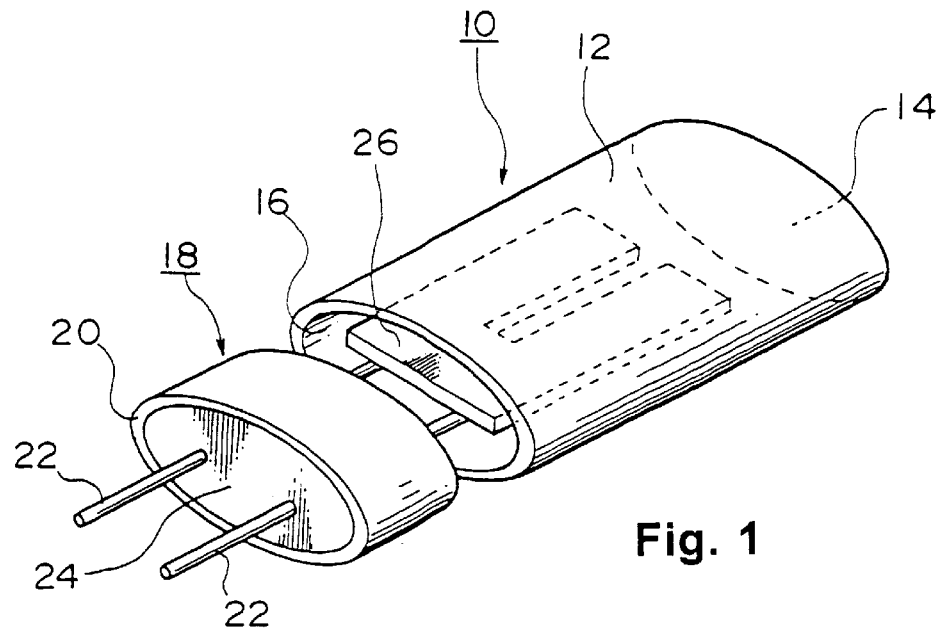
FIG. 1 is a perspective view showing a rough configuration of an embodiment of a container for enclosing a piezo-electric transducer according to the present invention.

Referring to the drawings, preferred embodiments (hereinafter referred to as "embodiments") of a container for enclosing a piezo-electric transducer according to the present invention will be described below.

Figure 2:
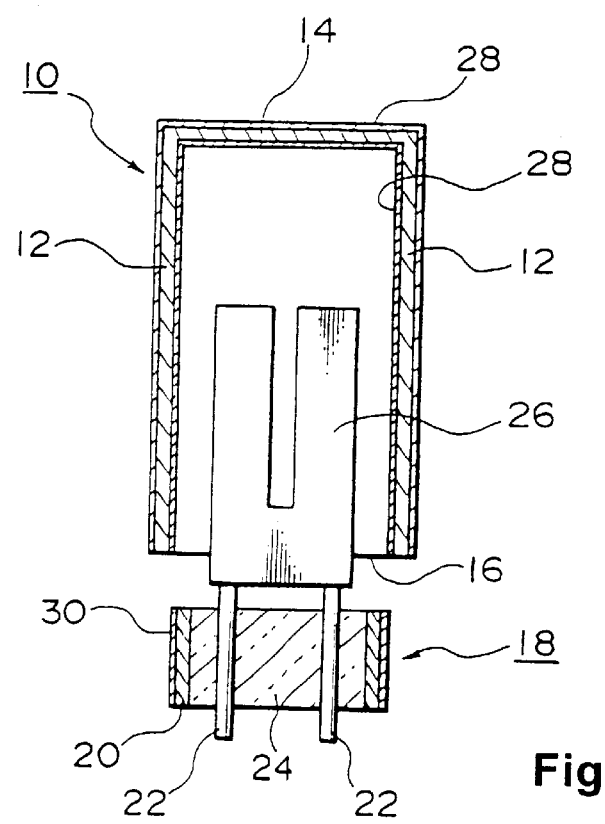
FIG. 2 is a cross-sectional view showing a rough configuration of this embodiment.

FIG. 1 is a perspective view showing a rough shape of this embodiment, and FIG. 2 is a cross-sectional view of this embodiment. A case 10 is cylindrical and its sectional shape is nearly elliptical. A rear end of a side 12 in FIG. 1 is closed with a bottom surface 14, and a front end 16 is open. The case 10 is made of a material such as nickel silver. A base 18 which has sectional shape nearly elliptical sectional shape is fitted into the aperture end 16. The base 18 has an outer circumference ring 20 nearly elliptical in shape and the inside of the outer circumference ring 20 is filled with sealing glass 24 for fixing two stems 22, which gives the base 18 the shape of a nearly elliptical cylinder as a whole. The outer circumference ring 20 and stems 22 are made of a material such as cobalt or 42 nickel. The stems 22 expand through the base 18 along the axis of the base 18 having the shape of a nearly elliptical cylinder and one end of each stem holds a nearly U piezo-electric transducer 26.

The piezo-electric transducer 26 is inserted into the case 10 and the aperture end 16 of the case 10 is closed with the base 18. As a result, the piezo-electric transducer 26 is enclosed. In this case the base 18 is press-fitted into the case 10. Therefore, the inner circumference of the case 10 is made so that it is a little smaller than the outer circumference of the base 18; this difference corresponds to a press-fitting allowance.

On the surface of the case 10, a nickel plating layer 28 of 5 to 10 $\mu$m is formed by electrolytic plating. The nickel plating layer 28 is not necessarily formed on the entire surface of the case 10. The nickel plating layer 28 only needs to be formed on the surface part of the case 10 which comes into contact with the base 18 when it is press-fitted into the case 10. In this embodiment nickel is used because of its low price, but single- or multi-layer plating of gold, silver, copper, chromium, and so on is also possible.

On the surface of the outer circumference ring 20 of the base 18, a copper plating layer of 1 to 5 $\mu$m is formed as a ground and a solder plating layer 30 of 15 to 25 $\mu$m is formed on it.

Figure 3:
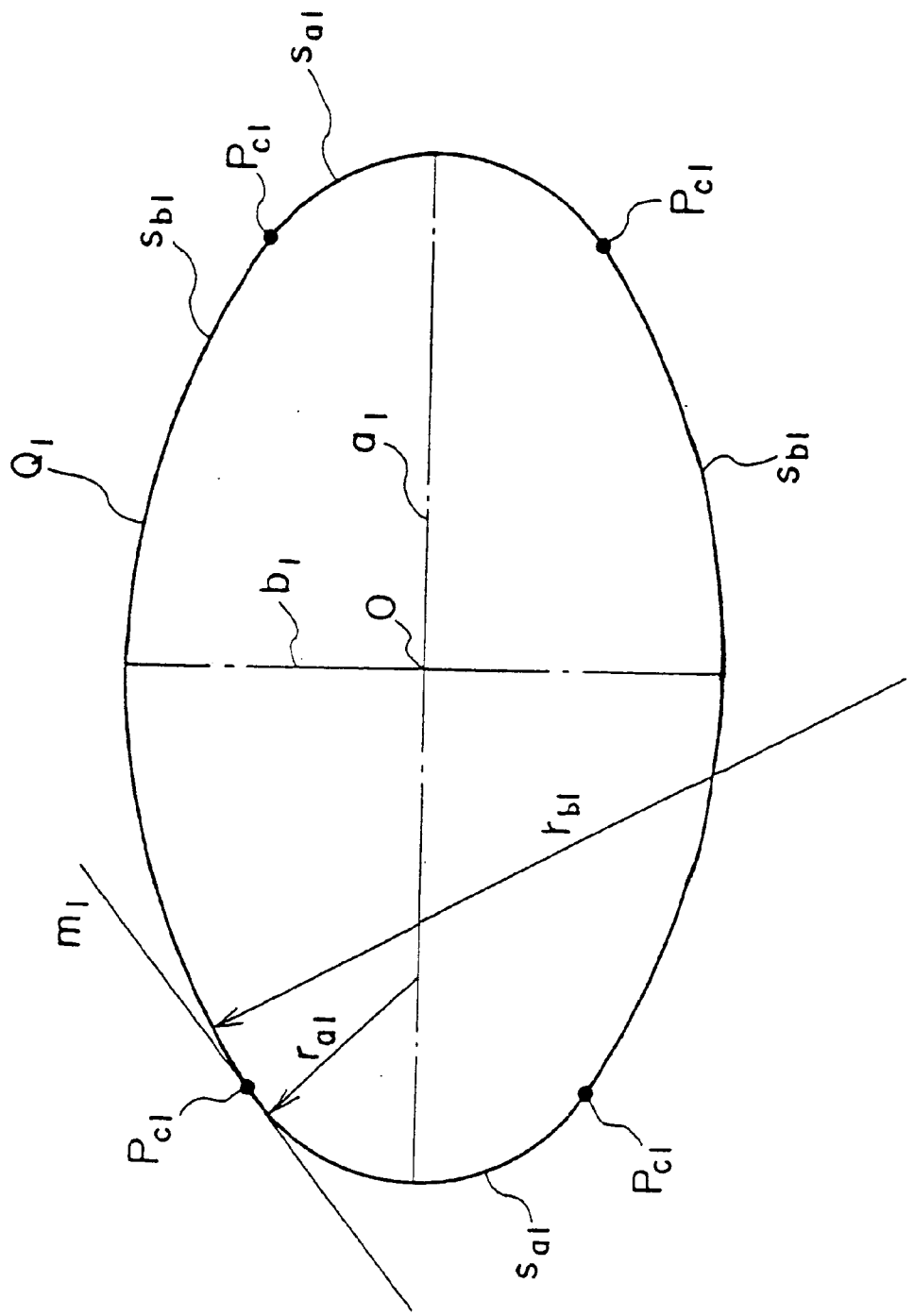
FIG. 3 is a diagram showing the detailed shape of the outer circumference of a base of this embodiment.

FIG. 3 shows an example of a detailed shape of the outer circumference of the plated base 18. A shape of the outer circumference Q1 of the base 18 is nearly elliptical. The near ellipse has a major axis a1 with a length of 3 mm and a minor axis b1 with a length of 2 mm which intersect at right angles at a center O, and consists of two kinds of circular arcs (four in total: two per kind). These circular arcs include major circular arcs Sb1 and minor circular arcs Sa1. The major circular arcs Sb1 intersect the minor axis b1 and have a radius of curvature rb1 (=2.0 mm). The minor circular arcs Sa1 intersect the major axis a1 and have a radius of curvature ra1 (=0.75 mm). These two kinds of circular arcs (four in total) connect at connection points Pc1. Therefore, the two kinds of circular arcs Sa1 and Sb1 are alternately arranged with the connection points Pc1 as boundaries. The near ellipse is symmetrical with respect to the major axis a1 and minor axis b1. Tangents m1 to two kinds of circular arcs Sa1 and Sb1 at the connection points Pc1 coincide. That is, the neighboring circular arcs Sa1 and Sb1 connect in a smooth way at the connection points Pc1.

Figure 4:
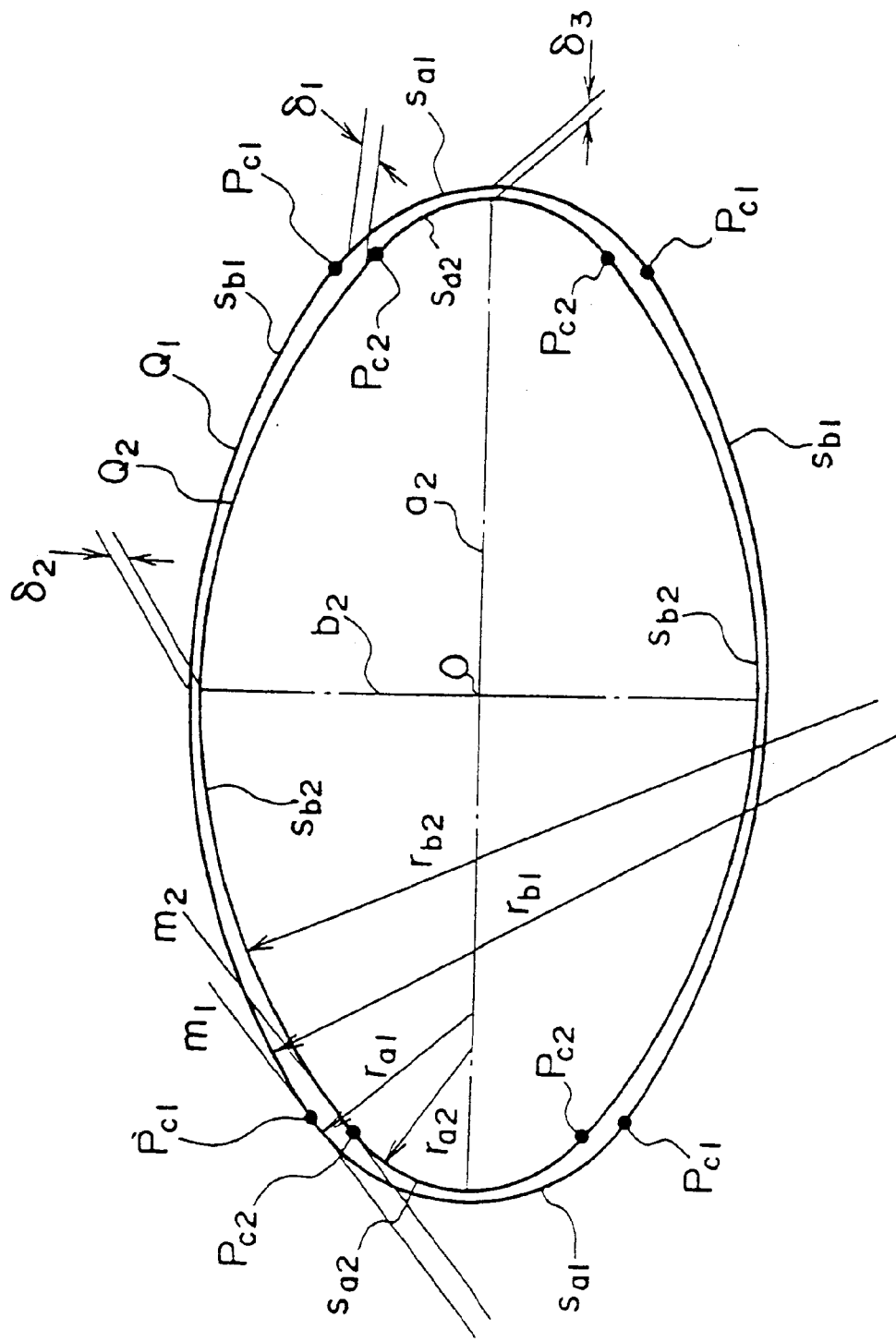
FIG. 4 is a diagram showing the detailed shapes of the outer circumference of a base and the inner circumference of a case of this embodiment, and showing press-fitting allowance.

FIG. 4 shows not only the shape of the outer circumference Q1 of the base 18 but also a detailed shape of the inner circumference of the case 10. A shape of the inner circumference Q2 of the case 10 is nearly elliptical. The near ellipse has a major axis a2 with a length of about 3 mm and a minor axis b2 with a length of about 2 mm which intersect at right angles at a center O, and consists of two kinds of circular arcs (four in total: two per kind). These circular arcs include major circular arcs Sb2 and minor circular arcs Sa2. The major circular arcs Sb2 intersect the minor axis b2 and have a radius of curvature rb2 (=1.926 mm). The minor circular arcs Sa2 intersect the major axis a2 and have a radius of curvature ra2 (=0.7 mm). These two kinds of circular arcs (four in total) connect at connection points Pc2. Therefore, the two kinds of circular arcs Sa2 and Sb2 are alternately arranged with the connection points Pc2 as boundaries. The near ellipse is symmetrical with respect to the major axis a2 and minor axis b2, and tangents m2 to two kinds of circular arcs Sa2 and Sb2 at the connection points Pc2 coincide. That is, the neighboring circular arcs Sa2 and Sb2 connect in a smooth way at the connection points Pc2.

As shown in FIG. 4, the shape of the inner circumference Q2 of the case 10 is a little smaller than the shape of the outer circumference Q1 of the base 18; this difference corresponds to a press-fitting allowance δ when the base 18 is tucked into the case 10. Strictly, the press-fitting allowance δ is defined as the difference between the shape of the inner circumference Q2 and the shape of the outer circumference Q1 along a normal to the outer circumference surface of the case 10. The shape of the inner circumference Q2 and the shape of the outer circumference Q1 are determined so that a press-fitting allowance δ1 at the parts near the connection points Pc1 and Pc2 has a maximum value (30 μm) and press-fitting allowances δ2 and δ3 at the parts intersecting the minor axis b1 and the major axis a1 at right angles have a minimum value (20 μm) respectively. Specifically, this can be achieved with the radii of the major and minor circular arcs ra1, rb1, ra2, and rb2 set to the appropriate values described above.

The above shape of the inner circumference Q2 of the case 10 and shape of the outer circumference Q1 of the base 18 are those of the parts where the base 18 touches when it is press fitted into the case 10. The shapes of the other parts may differ from them.

Forming a nearly elliptical shape by connecting two kinds of circular arcs as described above can be achieved using a simple machine and method because it is relatively easy to form a circular arc. Leakage is most likely to occur at the parts between the points where a circumference and major axis of an ellipse intersect at right angles and the points where the circumference and a minor axis of the ellipse intersect at right angles, and so widening press-fitting allowance at these parts prevents the leakage.

The case 10 and base 18 having the above shapes are fitted onto a jig which has been preheated to a temperature near and not exceeding the solid phase line of the solder plating on the base 18, and are left for several hours, for example, in a vacuum furnace with a pressure not exceeding 6.6 Pa (=5×10$^{-2}$ Torr) or a nitrogen gas atmosphere furnace with a steam pressure not exceeding 133 Pa (=1 Torr) and an oxygen partial pressure not exceeding 5%. This process removes any gas attached to the case, base, or piezo-electric transducer. Then the base 18 is press fitted into the aperture end 16 of the case 10 at a predetermined vacuum. As a result, the piezo-electric transducer 26 is enclosed in the case 10.

When the base 18 is press fitted into the case 10, the solder plating on the base 18 is in a solid phase state. However, it is heated to a temperature near the solid phase line, and so has become soft. When the base 18 is press fitted into the case 10 in this state, a narrow gap between the case 10 and base 18 is immediately filled with the solder having greater fluidity as a result of softening, resulting in reliable sealing.

Forming a nearly elliptical shape by connecting two kinds of circular arcs as in this embodiment can be achieved using a simple machine and method because it is relatively easy to form a circular arc. Therefore, this does not cause a rise in the cost. Leakage is most likely to occur at the parts between the points where a circumference and major axis of an ellipse intersect at right angles and the points where the circumference and a minor axis of the ellipse intersect at right angles, and so widening the press-fitting allowance at these parts prevents the leakage. Further, a narrow gap can be reliably sealed with solder heated to a temperature near the solid phase line. Adding this to the setting of the press-fitting allowance makes it possible to perfectly eliminate the leakage.

The measurements of each part in the above embodiment is not limited to that described above and may be changed as necessary. For example, if the values of the radii of the circular arcs ra1, rb1, ra2, and rb2 are assumed to be 0.75, 2.0, 0.63, and 1.914 mm respectively, the shape of the inner circumference Q2 and the shape of the outer circumference Q1 can be determined so that a press-fitting allowance δ1 at the parts near the connection points Pc1 and Pc2 has a maximum value (40 μm), a press-fitting allowance δ3 at the parts intersecting the major axis a1 at right angles has a minimum value (20 μm), and a press-fitting allowance δ2 at the parts intersecting the minor axis b1 at right angles has a value of 30 μm which is between the middle of the values of press-fitting allowances δ1 and δ3.

In this case, as in the above embodiment, leakage can be reliably eliminated. Further, a simple working machine and method can be used because it is relatively easy to form a circular arc. Therefore, this does not cause a rise in the cost.

Figure 5:
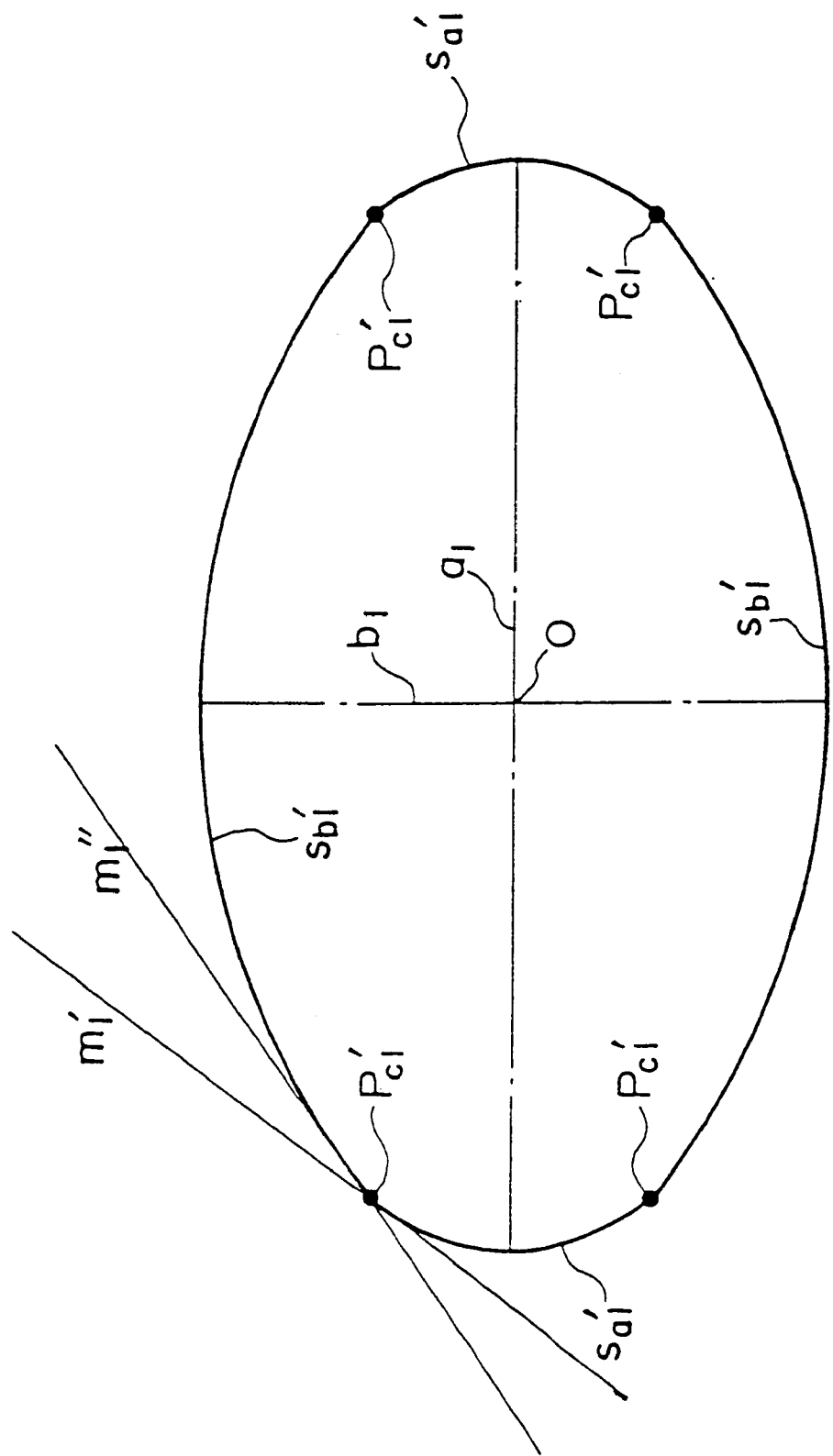
FIG. 5 is a diagram showing the detailed shape of the outer circumference of a base of another embodiment of a container for enclosing a piezo-electric transducer according to the present invention.

In the above embodiment, it is assumed that the minor circular arcs Sa1 and Sa2 and major circular arcs Sb1 and Sb2 connect in a smooth way at the connection points Pc1 and Pc2, but another way of connecting them may be used. As shown in FIG. 5, for example, even if an angle is formed at a connection point Pc1', two circular arcs Sa1' and Sb1' connect in a virtually smooth way by plating, as described above, with an angle of 0 to 30 degrees formed by a tangent m1' to a minor circular arc Sa1' and a tangent m1" to a major circular arc Sb1'. Experiment has shown that if an angle formed by tangent m1' and tangent m1" falls within this range, a container can be reliably sealed and the same effect as the above embodiments can be obtained.

Further, the press-fitting allowance δ is not limited to the above values. A minimum press-fitting allowance δ3 of 10 to 20 μm corresponding to a major axis and a maximum press-fitting allowance δ1 of 20 to 100 μm which is two to five times wider than the minimum press-fitting allowance δ3 also have the same effect as the above embodiments.

Figure 6:
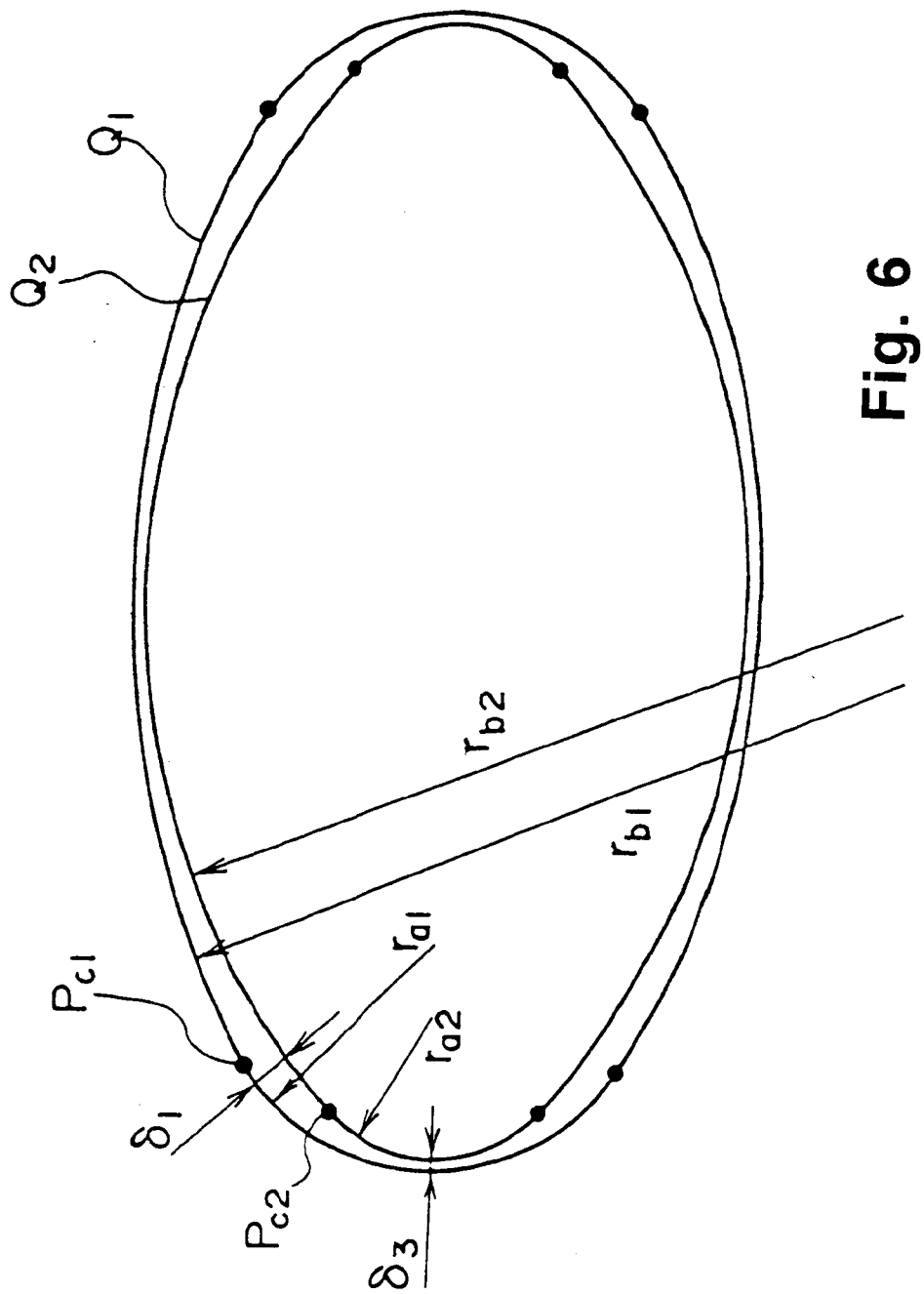
FIG. 6 is a diagram showing the detailed shapes of the outer circumference of a base and the inner circumference of a case of still another embodiment of a container for enclosing a piezo-electric transducer according to the present invention, and showing press-fitting allowance.

FIG. 6 shows an example in which a maximum press-fitting allowance δ1 is five times wider than a minimum press-fitting allowance δ3. In this case, if the values of the radii of circular arcs ra1, rb1, ra2, and rb2 are assumed to be 0.85, 2.333, 0.57, and 1.785 mm respectively, a press-fitting allowance δ1 at the parts near connection points Pc1 and Pc2 has a maximum value (100 μm) and a press-fitting allowance δ3 at the parts intersecting a major axis a1 at right angles has a minimum value (20 μm).

It is desirable to use, for the solder of the plating layer 30, that composed of lead (90 to 99% in weight percentage) and tin (the remainder). Solder with such a composition has a high melting point, so that it does not melt when the container is mounted on a printed-circuit board. It is desirable that metal used for the plating layer 28 has a higher melting point than the above solder. When a container is mounted on a printed-circuit board, its temperature will reach about 200 to 240° C. But if these plating layers 28 and 30 are formed, the seal of a enclosing container does not loosen, resulting in high reliability.

Figure 7:
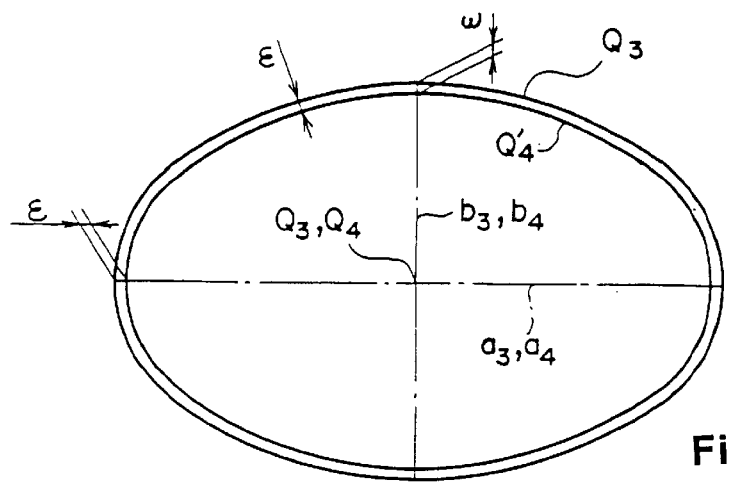
FIG. 7 is a diagram showing, together with FIG. 8, how to determine the position with a maximum press-fitting allowance in still another embodiment of a container for enclosing a piezo-electric transducer according to the present invention.
Figure 8:
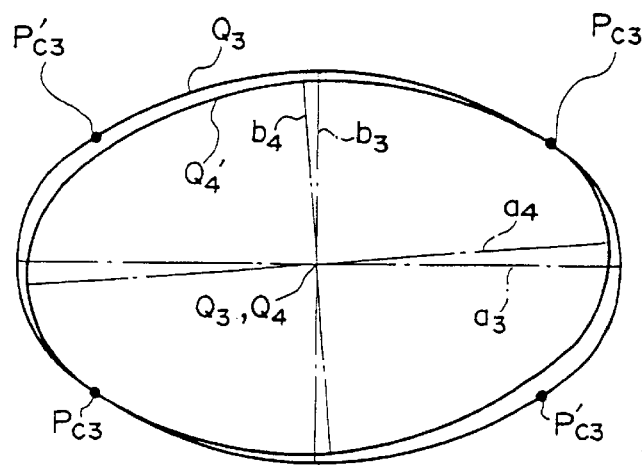
FIG. 8 is a diagram showing, together with FIG. 7, how to determine the position with a maximum press-fitting allowance in still another embodiment of a container for enclosing a piezo-electric transducer according to the present invention.
Figure 9:
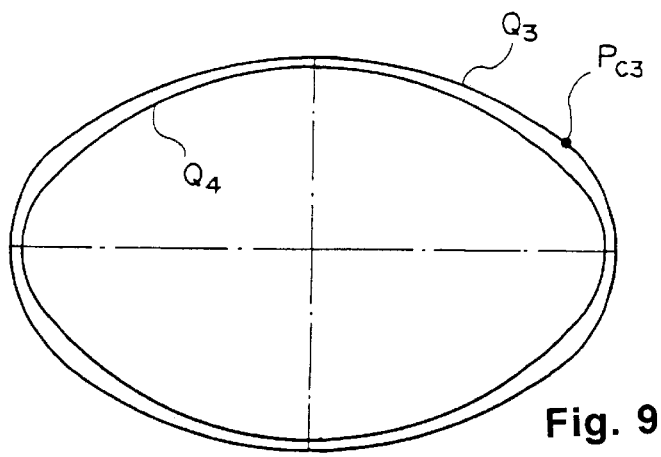
FIG. 9 is a diagram showing the detailed shapes of the outer circumference of a base and the inner circumference of a case obtained by the method described in FIGS. 7 and 8.

In FIGS. 7–9, another embodiment of the present invention is shown. The basic configuration of this embodiment is the same as that of FIGS. 1 and 2. They differ in how to set press-fitting allowance, especially the position of a point with a maximum press-fitting allowance.

FIGS. 7 and 8 show how to determine the position of a point with a maximum press-fitting allowance in this embodiment. As in the above embodiment, the shape of an outer circumference Q3 of the base 18 consists of two kinds of circular arcs: two major ones and two minor ones are alternately arranged. The shape of the outer circumference Q3 is nearly elliptical and has a center O3, a major axis a3, and a minor axis b3. The shape of an inner circumference Q4' of the case 10 forming a uniform press-fitting allowance ε along its circumference to the shape of the outer circumference Q3 of the base 18 is assumed. The assumed shape of the inner circumference Q4' is nearly elliptical and has a center O4 (=O3), a major axis a4 (=a3-2ε), and a minor axis b4 (=b3-2ε). As is known from FIG. 7, the major axis a3 of the shape of the outer circumference Q3 and the major axis a4 of the shape of the inner circumference Q4' coincide; the minor axis b3 of the shape of the outer circumference Q3 and the minor axis b4 of the shape of the inner circumference Q4' also coincide. As shown in FIG. 8, the assumed shape of the inner circumference Q4' of the case 10 is turned around the center O4 inside the shape of the outer circumference Q3 of the base 18. A point where the turned shape of the inner circumference Q4' of the case 10 first comes into contact with the shape of the outer circumference Q3 of the base 18 is assumed to be point Pc3, and a point symmetrical to the point Pc3 with respect to the major axis a3 is assumed to be point Pc3'. As shown in FIG. 7, if the base 18 is press fitted into the aperture end 16 of the case 10 with the major axes and minor axes coincident respectively, a uniform press-fitting allowance is formed along the entire circumference. As shown in FIG. 8, however, the base 18 may be press fitted into the aperture end 16 of the case 10 with the major axes and minor axes not coincident respectively. In this case, an actual press-fitting allowance at the point Pc3 becomes smaller and leakage may occur at this point. In this embodiment, therefore, an actual shape of an inner circumference of the case 10 is designed so that press-fitting allowances at the points Pc3 and Pc3' have a maximum value. FIG. 9 shows the shape of an outer circumference Q3 of the base 18 and the shape of an inner circumference Q4 of the case 10 in that case.

As in the above embodiment, if an angle formed by two lines each of which is a tangent to one of two different circular arcs at their connection point falls within a range of 0 to 30 degrees, this embodiment produces a good effect. Also, as in the above embodiment, if a minimum press-fitting allowance is set to 10 to 20 μm and a maximum press-fitting allowance is set to 20 to 100 μm which is two to five times wider than the minimum press-fitting allowance, this embodiment produces a good effect. Further, if solder which is the same as that in the above embodiment is used, the seal of a enclosing container does not loosen, resulting in high reliability.

Figure 10:
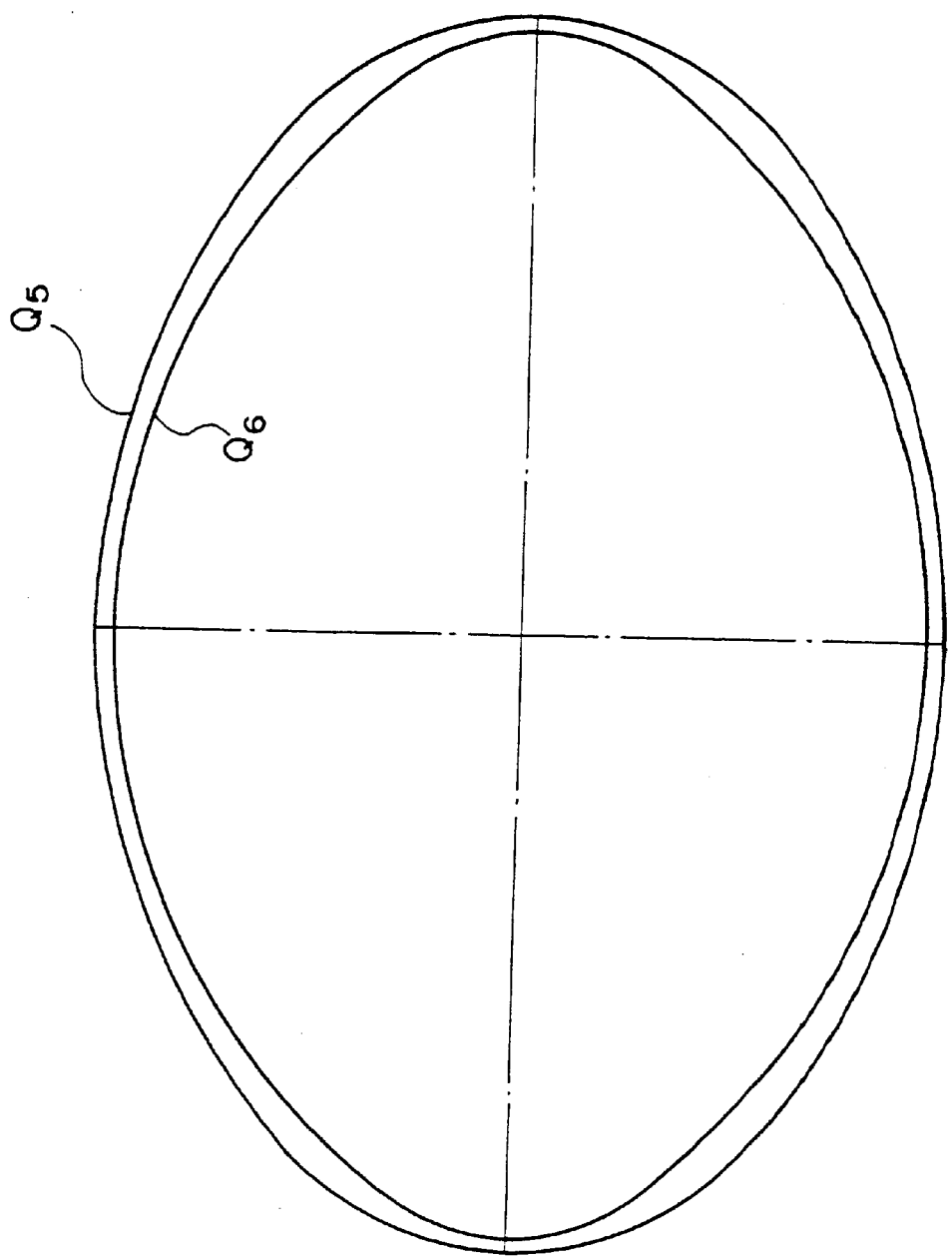
FIG. 10 is a diagram showing the detailed shapes of the outer circumference of a base and the inner circumference of a case of still another embodiment of a container for enclosing a piezo-electric transducer according to the present invention.

FIG. 10 shows still another embodiment of a container for enclosing a piezo-electric transducer according to the present invention. The basic configuration of this embodiment is the same as that of FIGS. 1 and 2. They differ in the shapes of an outer circumference of the base 18 and an inner circumference of the case 10.

There is a difference between the above embodiments and this embodiments. That is, the shape of an outer circumference Q5 of the case 18 is not nearly elliptical but exactly elliptical. The shape of an inner circumference Q6 of the case 10 is set so that the predetermined parts between minor and major axes have a maximum press-fitting allowance. The positions of points having a maximum press-fitting allowance can be determined by the method described with FIGS. 7 and 8, and press-fitting allowance may be set by checking a prototype for actual leakage.

As in the above embodiment, the shape of the inner circumference Q6 of the case 18 may consist of two kinds of circular arcs connected to each other. If an angle formed by two lines, each of which is a tangent to one of two different circular arcs at their connection point, falls within a range of 0 to 30 degrees, this embodiment produces a good effect. As in the above embodiments, if a minimum press-fitting allowance is set to 10 to 20 μm and a maximum press-fitting allowance is set to 20 to 100 μm which is two to five times wider than the minimum press-fitting allowance, this embodiment produces a good effect. Further, if solder which is the same as that in the above embodiments is used, the seal of an enclosing container does not loosen, resulting in high reliability.

In the embodiments shown in FIGS. 7–10, the shape of an inner circumference of the case 10 is determined by the shape of an outer circumference of the base 18. However, in order to obtain a desired press-fitting allowance, the shape of an outer circumference of the base 18 may be determined by the shape of an inner circumference of the case 10.

Figure 11:
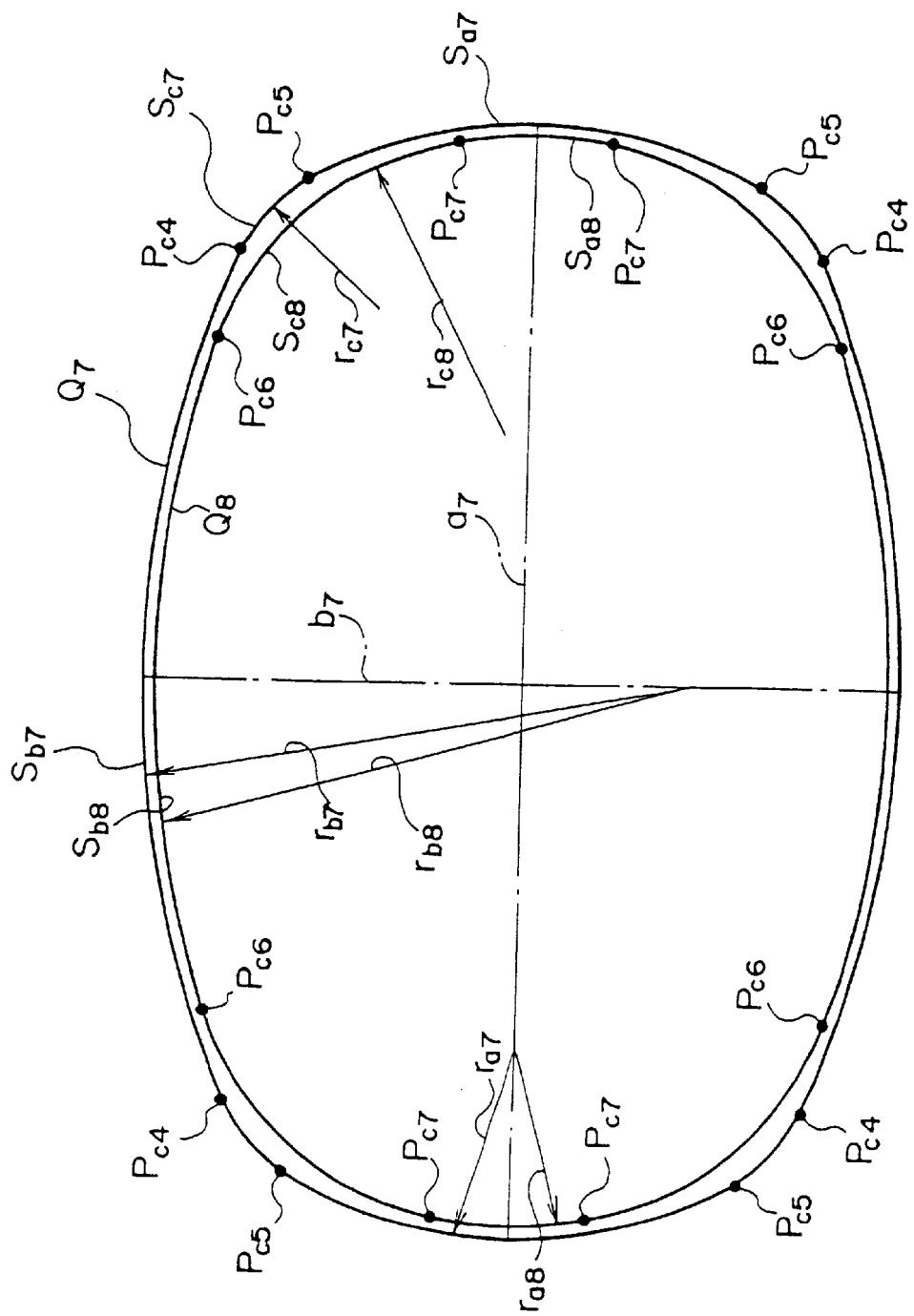
FIG. 11 is a diagram showing the detailed shapes of the outer circumference of a base and the inner circumference of a case of still another embodiment of a container for enclosing a piezo-electric transducer according to the present invention.

FIG. 11 shows still another embodiment of the present invention. The basic configuration of this embodiment is the same as that of FIGS. 1 and 2. They differ in how to form a nearly elliptical shape. That is, the above embodiment used two kinds of circular arcs, but this embodiment uses three kinds of circular arcs.

FIG. 11 shows the shape of an outer circumference Q7 of the base 18 and the shape of an inner circumference Q8 of the case 10 of this embodiment. The shapes of the circumference Q7 and Q8 are both formed with three kinds of circular arcs combined. That is, the shape of the outer circumference Q7 of the base 18 has a major axis a7 (=3.0 mm) and a minor axis b7 (=2.0 mm) and consists of the first circular arcs Sa7 (radius ra7=1.2 mm), the second circular arcs Sb7 (rb7=3.0 mm), and the third circular arcs Sc7 (rc7=0.4 mm) connecting at connection points Pc4 and Pc5. The shape of the inner circumference Q8 of the case 10 consists of the first circular arcs Sa8 (radius ra8=1.17 mm), the second circular arcs Sb8 (rb8=2.97 mm), and the third circular arcs Sc8 (rc8=0.8 mm) connecting at connection points Pc6 and Pc7. The shape of the outer circumference Q7 of the base 18 and the shape of the inner circumference Q8 of the case 10 are each symmetrical with respect to their major and minor axes.

In this embodiment, press-fitting allowances at the parts intersecting the major or minor axis are 30 μm and maximum press-fitting allowances formed between the third circular arcs Sc8 of the inner circumference of the case 10 and the third circular arcs Sc7 of the outer circumference of the base 18 are 70 μm. Each circular arc connects in a smooth way at each connection point. As described above, however, if an angle formed by two lines each of which is a tangent to one of two different circular arcs at their connection point, falls within a range of 0 to 30 degrees, the two different circular arcs are really considered to connect in a smooth way. In this embodiment, three kinds of circular arcs are used to form the shapes of an outer circumference of the base 18 and an inner circumference of the case 10, but more kinds of circular arcs may be used.

While what has been described are, at present, considered to be preferred embodiments of the invention, it will be understood that various modifications may be made thereto, and it is intended that the appended claims cover all such modifications falling within the true spirit and scope of the invention.

We claim:

1. A container for enclosing a piezo-electric transducer comprising:

a cylindrical case for housing the piezo-electric transducer therein; and a base for sealing an aperture part of said case, wherein said base comprises a columnar body with a nearly elliptical cross section with minor and major axes, two major circular arcs, $S_b$, which intersect said minor axis, two minor circular arcs, $S_a$, which intersect said major axis, and wherein in each quadrant of said cross section a respective major circular arc, $S_b$, and a respective minor circular arc, $S_a$, intersect at a connection point, $P_c$, said case comprises a tubular body having one end closed and one end open, and an inner circumference, the inner circumference having a cross section with a minor and a major axis, two major circular arcs, $S_b$, two minor circular arcs, $S_a$, the two major circular arcs, $S_b$, intersecting said minor axis, the two minor circular arcs $S_a$ intersecting said major axis, the two major circular arcs $S_b$ intersecting the two minor circular arcs $S_a$ at four connection points $P_c$ on the inner circumference, the connection points $P_c$ each positioned in each quadrant of said cross section, wherein said case is disposed adjacent said base along the inner circumference, and the inner circumference has a nearly elliptical cross section smaller than the nearly elliptical cross section of said base; and a press-fitting allowance is provided between said base and said case and said press-fitting allowance, δ, has a maximum value, $δ_1$, between said base connection point, $P_c$, and case connection point, $P_c$, in each respective quadrant of a respective near ellipse.

2. A container for enclosing a piezo-electric transducer according to claim 1, wherein, said press-fitting allowance has a minimum value, $δ_3$, at said respective major axes of said near ellipse.

3. A container for enclosing a piezo-electric transducer according to claim 2, wherein the press-fitting allowance has a value, $δ_2$, at said respective minor axes of said near ellipse and the value, $δ_2$, is greater than said minimum value, $δ_3$.

4. A container for enclosing a piezo-electric transducer according to claim 1, wherein at the connection point, $P_c$, of said major and minor circular arcs of said base or said case, a tangent to a respective major circular arc, $S_b$, and a tangent to a respective minor circular arc, $S_a$, form an angle of 0 to 30 degrees.

5. A container for enclosing a piezo-electric transducer comprising:

a cylindrical case for housing the piezo-electric transducer therein; and a base for sealing an aperture part of said case, wherein said base comprises a columnar body with a nearly elliptical cross section with minor and major axes, two major circular arcs, $S_b$, which intersect said minor axis, two minor circular arcs, $S_a$, which intersect said major axis and a third circular arc, $S_c$, which connects said major circular arcs, $S_b$, and said minor circular arcs, $S_a$, wherein in each quadrant of said cross section a respective major circular arc, $S_b$, and a respective minor circular arc, $S_a$, are connected by said third circular arc, $S_c$, at connection points, $P_c$, said case comprises a tubular body having one end closed and one end open, and wherein an inner circumference comprises a cross section with minor and major axes, two major circular arcs, $S_b$, which intersect said minor axis, two minor circular arcs, $S_a$, which intersect said major axis, and a third circular arc, $S_a$, which connects said major circular arcs, $S_b$, and said minor circular arcs, $S_a$, and wherein in each quadrant of said cross section a respective major circular arc, $S_b$, and a respective minor circular arc, $S_a$, are connected by said third circular arc, $S_c$, at connection points, $P_c$, and where cross-sectrion of that is said case adjacent to said base is a near ellipse, smaller than that of the cross section of said base, and a press-fitting allowance is provided between said base and said case and said press-fitting allowance, δ, has a maximum value, $δ_1$, in at least one part on said base third circular arc, $S_c$, or said case third circular arc, $S_c$.

6. A container for enclosing a piezo-electric transducer according to claim 5, wherein, said press-fitting allowance has a minimum value, $δ_3$, at said respective major axes of said near ellipse.

7. A container for enclosing a piezo-electric transducer according to claim 6, wherein said press-fitting allowance has a value, $δ_2$, at said respective minor axes of said near ellipse that is greater than said press-fitting allowance value, $δ_3$.

8. A container for enclosing a piezo-electric transducer according to claim 5, wherein at the connection point, $P_c$, of said major, $S_b$, and minor, $S_a$, circular arcs to said third circular arc, $S_c$, of said base or said case, a tangent to a respective major, $S_b$, or minor, $S_a$, circular arc and a tangent to a respective third circular arc, $S_c$, form an angle of 0 to 30 degrees.

9. A container for enclosing a piezo-electric transducer comprising:

a cylindrical case for housing the piezo-electric transducer, said case comprising a tubular body having one end closed and one end open, and wherein an inner circumference of said tubular body has a nearly elliptical cross section with a minor axis and a major axis, two major arcuate portions which intersect said minor axis and two minor arcuate portions which intersect said major axis, and wherein said major and minor arcuate portions join at case connection regions;

a base for sealing an aperture part of said case, wherein said base comprises a columnar body with a nearly elliptical cross section with a minor axis and a major axis, two major arcuate portions which intersect said minor axis of said base, and two minor arcuate portions which intersect said major axis of said base, and wherein said major and minor arcuate portions join at base connection regions, and wherein said cross section of said case is smaller than said cross section of said base, and wherein a press-fitting allowance is provided between said cross section of said base and said cross section of said case and said press-fitting allowance is a maximum between said base and case connection regions.

10. A container as claimed in claim 9 wherein said base connection regions comprise a third arcuate portion disposed between said major and minor arcuate portions and wherein said case connection regions comprise a third arcuate portion disposed between said major and minor arcuate portions.

11. A container as claimed in claim 9 wherein said press-fitting allowance is a minimum at or near where said case and base minor arcuate portions intersect said major axis.

12. A container as claimed in claim 9 wherein said press-fitting allowance at or near where said base and case major arcuate portions intersect said minor axis than at or near where said base and case minor arcuate portions intersect said major axis.

13. A container as claimed in claims 9 wherein said wherein tangents of adjacent arcuate portions form an angle from 0 to 30 degrees.

* * * * *